(12) United States Patent
van der Burgt

(10) Patent No.: US 7,120,406 B2
(45) Date of Patent: Oct. 10, 2006

(54) MULTIBAND RECEIVER AND METHOD ASSOCIATED THEREWITH

(75) Inventor: Chiron van der Burgt, Gk Enschede (NL)

(73) Assignee: Siemens Aktiengesellschaft, Munich (DE)

( * ) Notice: Subject to any disclaimer, the term of this patent is extended or adjusted under 35 U.S.C. 154(b) by 152 days.

(21) Appl. No.: 10/490,321

(22) PCT Filed: Sep. 19, 2001

(86) PCT No.: PCT/DE01/03610

§ 371 (c)(1),
(2), (4) Date: Jun. 11, 2004

(87) PCT Pub. No.: WO03/028206

PCT Pub. Date: Apr. 3, 2003

(65) Prior Publication Data

US 2005/0003853 A1    Jan. 6, 2005

(51) Int. Cl.
*H04B 1/18* (2006.01)

(52) U.S. Cl. .............. 455/168.1; 455/302; 455/304; 455/307; 455/314

(58) Field of Classification Search .......... 455/302, 455/304, 307, 314, 319, 168.1
See application file for complete search history.

(56) References Cited

U.S. PATENT DOCUMENTS

| 5,661,761 | A |   | 8/1997  | Iwamatsu |         |
|-----------|---|---|---------|----------|---------|
| 5,822,704 | A | * | 10/1998 | Ishii    | 455/553.1 |
| 6,125,271 | A | * | 9/2000  | Rowland, Jr. | 455/313 |
| 6,133,804 | A | * | 10/2000 | Wagner et al. | 332/127 |
| 6,219,534 | B1 |  | 4/2001  | Torii    |         |
| 6,658,237 | B1 | * | 12/2003 | Rozenblit et al. | 455/83 |
| 6,683,919 | B1 | * | 1/2004 | Olgaard et al. | 375/316 |
| 6,714,604 | B1 | * | 3/2004 | Tsurumi et al. | 375/329 |
| 6,778,594 | B1 | * | 8/2004 | Liu      | 375/222 |
| 2001/0036838 | A1 | * | 11/2001 | Higuchi | 455/552 |
| 2002/0021762 | A1 | * | 2/2002 | Takagi   | 375/261 |
| 2003/0072393 | A1 | * | 4/2003 | Gu       | 375/322 |

FOREIGN PATENT DOCUMENTS

EP      0 574 273      12/1993
WO      WO 99/14863    3/1999

OTHER PUBLICATIONS

XP-000557254 Crols, "Aingle Chip 900.HMZ CMOS Receiver Front End with a High Performance Low if Topology", IEEE Journal of Solid State Circuits, vol. 30, No. 12, Dec. 1, 1995, pp. 1483-1492.
XP-000736695, Borrallo et al., "Self Adjusting Digital Image Rejection Receiver for Mobile Communications" Vehicular Technology, Apr. 5, 1997, pp. 686-690.

* cited by examiner

Primary Examiner—Matthew D. Anderson
Assistant Examiner—Tuan Pham
(74) Attorney, Agent, or Firm—Bell, Boyd & Lloyd LLC

(57) ABSTRACT

A multiband receiver and associated method are provided for simultaneous reception of a number of RF signals with partially different carrier frequencies. An RF/IF converter is provided with a number of local oscillators corresponding to a number of RF signals in order to produce L0 in phase components corresponding to the carrier frequencies and quadrature components; in addition to an in-phase mixer and a quadrature mixer for mixing the respective L0 in-phase and quadrature components with the RF signals in order to produce intermediate frequency signals with IF in-phse components and IF quadrature components. A complex fiber carries out complex filtering on the basis of the intermediate frequency signals in order to suppress reflected intermediate frequency signals.

23 Claims, 4 Drawing Sheets

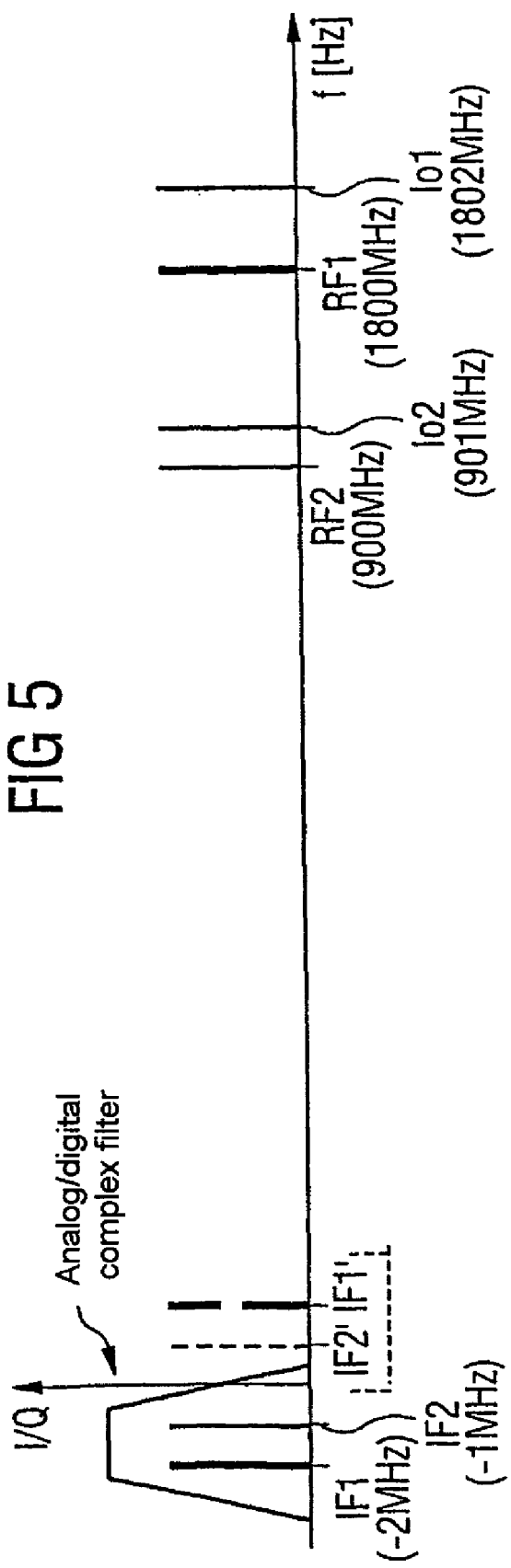

MULTIBAND RECEIVER AND METHOD ASSOCIATED THEREWITH

BACKGROUND OF THE INVENTION

The present invention relates, generally, to a multiband receiver as well as to an associated method and, more particularly to a multiband receiver for simultaneous reception of multiband RF signals, some of which are at different carrier frequencies.

The use of telecommunications networks using, for example, mobile radio systems has developed increasingly in recent years, leading to situations in which, in addition to earlier telecommunications radio networks, new networks, such as cellular networks, are often being added.

As a consequence, a large number of different transmission standards are increasingly coexisting alongside one another; for example, digital and analog mobile telecommunications networks. By way of example, the GSM Standard (Global System for Mobile Communication), the DECT Standard (Digital European Cordless Telecommunication) and the UMTS Standard (Universal Mobile Telecommunication System) may be mentioned as digital telecommunications networks in Europe. Worldwide, the PCS1900 (Personal Communication Services), DCS1800 (Digital Cellular System) or JDC (Japanese Digital Cellular) Standards furthermore may be mentioned by way of example. This large number of different communications networks and transmission standards are based on either substantially the same or quite often different carrier frequencies.

By way of example, there is a need to connect a notebook via a "Bluetooth" interface to a mobile telephone, and to connect this mobile telephone via a GSM interface to the Internet, in the process of which two different RF signals have to be received at the same time via different interfaces in the mobile telephone.

There is, therefore, an increasing requirement to provide a receiver which is at the same time compatible with at least two or more transmission standards and frequency bands. Telecommunications terminals with receivers such as these are normally referred to as dual-band or triband terminals and allow reception of RF signals (radio frequency signals) to two or three transmission standards.

Two or more radio receivers (radios) that are separate from one another normally have been combined with one another in order to produce such multiband receivers. However, this results in extraordinarily high costs for implementation.

Furthermore, the document EP 0 945 990 A1 discloses a multiband receiver for reception of multiband RF signals, some of which are at different carrier frequencies, with an RF/IF converter converting the RF signals (radio frequency) to so-called intermediate frequency signals. To be more precise, a local oscillator is, in this case, used to produce two intermediate frequencies for, for example, the different standards GSM1800 and GSM1900, thus producing a dual-band receiver. However, this has the disadvantage that it is restricted to a relatively small number of carrier frequencies, and to carrier frequencies in a similar frequency band, as well as the disadvantage of the use of expensive intermediate frequency paths.

In contrast, the present invention is directed toward a multiband receiver and an associated method via which multiband RF signals, some of which are at different carrier frequencies, can be received at the same time in a cost-effective and flexibly adaptable manner.

SUMMARY OF THE INVENTION

According to the present invention, the use of an RF/IF converter for conversion of the RF signals to a large number of intermediate frequency signals, with a large number (which corresponds to the large number of RF signals) of local oscillators being used to produce in-phase and quadrature components associated with the carrier frequencies, as well as the use of an in-phase and quadrature mixer for mixing the respective in-phase and quadrature components with the RF signals in order to produce IF in-phase and IF quadrature components in an intermediate frequency band, allow the intermediate frequency signals which are desired for further processing to be filtered out in a simple and very accurate manner using an additional complex filter, on the basis of the intermediate frequency signals. Thus, not only is it possible to use a single radio receiver for a large number of multiband radio frequencies or RF signals at the same time, but this also results in an extremely flexible configuration for implementation of transmission standards which have not yet been agreed or have so far been agreed only with a very great degree of difficulty.

The intermediate frequency signals preferably have unreflected and mirror-image signals in a low intermediate frequency band (low IF), with the complex filter producing a phase shift between the associated in-phase and quadrature components of these signals such that the undesirable mirror-image signal components are at least partially canceled out. The use of signals in a low intermediate frequency band allows the provision of particularly low-cost multiband receivers. The complex filtering may, in this case, be carried out on an analog or digital basis, using analog or digital intermediate frequency signals. If the mirror-image or unreflected signals all lie in the same positive or negative frequency band, the complex filter can be implemented particularly easily.

The local oscillators preferably produce LO signals which do not interfere at all with one another, so that the signal quality can be improved considerably. By way of example, a polyphase filter is used as the complex filter.

In order to further improve the reception quality, the multiband receiver may have a preamplifier in its RF receiving part, which has a frequency splitter for splitting the RF signals into their associated carrier frequency bands, separate amplifier paths for amplification of the RF signals in the respective carrier frequency bands, and a signal combiner for combination of the split and amplified RF signals. So-called low noise preamplification can be carried out for each carrier frequency band, particularly if the amplifier paths each have an RF bandpass filter and a variable RF amplifier.

The reception quality also can be improved by using an amplifier path with a variable IF amplifier and an IF low-pass filter in an intermediate frequency receiving part.

Digital signal processing which is arranged on the output side preferably has a large number of local oscillators for production of signal components which are associated with the determined intermediate frequency signals, and a large number of digital low-pass filters for filtering the digital signal components. This results in high-quality further processing of the intermediate frequency signals which are in the low intermediate frequency band.

Additional features and advantages of the present invention are described in, and will be apparent from, the following Detailed Description of the Invention and the Figures.

BRIEF DESCRIPTION OF THE FIGURES

FIG. 5 shows a simplified spectral illustration of signals according to a further exemplary embodiment of the present invention, which is not illustrated.

DETAILED DESCRIPTION OF THE INVENTION

The present invention will be described in the following text with reference, by way of example, to a dual-band receiver, which receives RF signals at carrier frequencies in an 1800 MHz band and in a 900 MHz band. The stated frequencies will be used in this case only to illustrate the basic principle.

Figure 1:
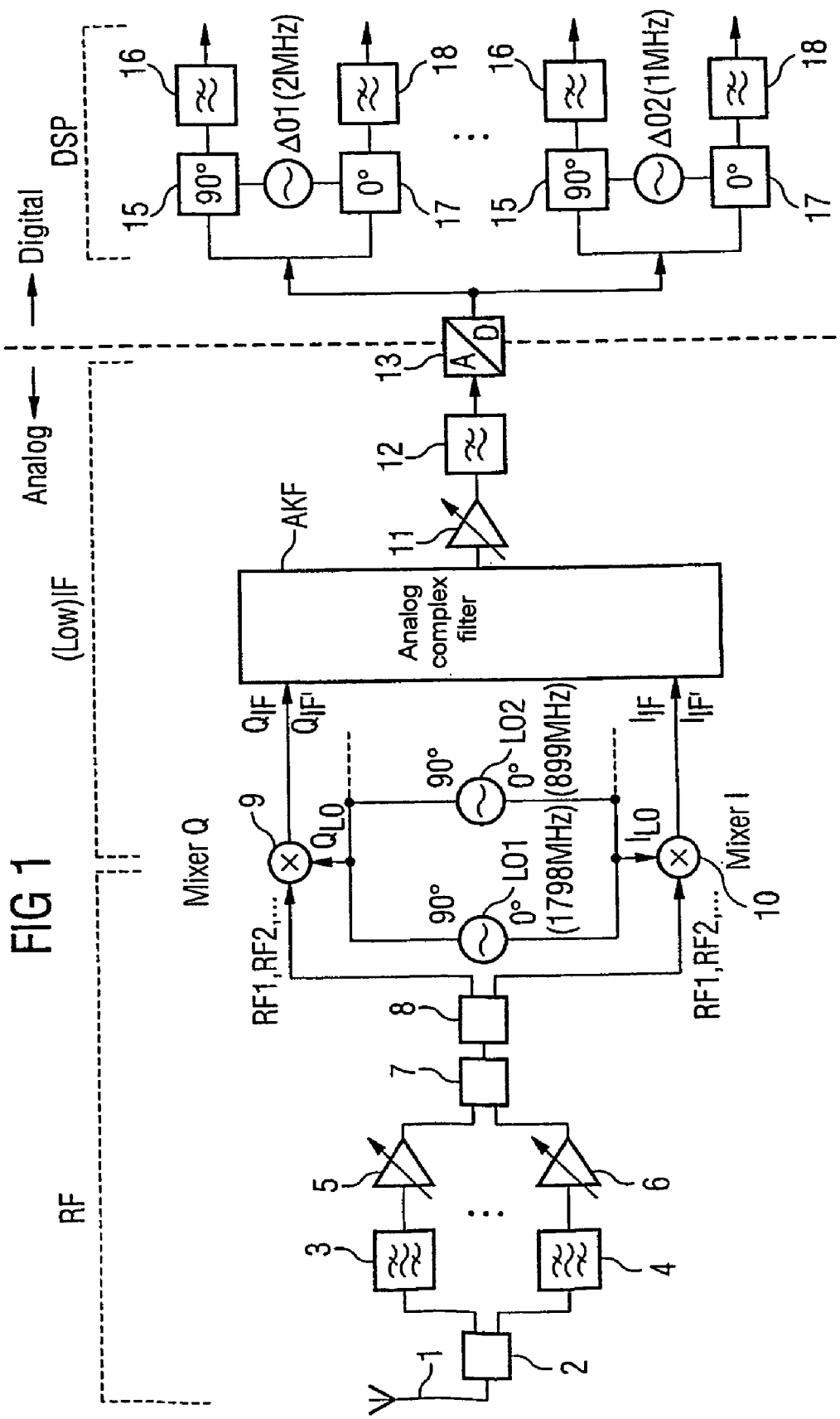
FIG. 1 shows a simplified block diagram of a multiband receiver according to a first exemplary embodiment of the present invention.

FIG. 1 shows a simplified block diagram of a multiband receiver for reception of two RF signals which are transmitted in a carrier frequency band at 1800 MHz and 900 MHz. An RF receiving part RF is used for reception of the RF signals via, for example, an antenna 1 and preprocessing via a preamplifier which includes the blocks 2 to 7. However, the antenna 1 may be replaced in the same way by a coaxial cable connection or some other connection for cable-based reception of RF signals. The preamplifier is used for so-called low noise amplification, and may, in principle also be omitted.

As is shown in FIG. 1, the input signal, which has at least two RF signals and is received at the antenna 1, is split in a frequency splitter 2 into RF signals with their associated carrier frequency bands. To be more precise, an RF signal RF1 which is transmitted, by way of example, at the carrier frequency of 1800 MHz is in this case passed to a first amplifier path, which includes the blocks 3 and 5, and an RF signal RF2 which is transmitted at the carrier frequency of 900 MHz is passed to the amplifier path which includes the blocks 4 and 6. In this case, RF bandpass filtering is carried out in the blocks 3 and 4 in order to improve the respective RF signals RF1 and RF2. They are then amplified separately in the RF amplifiers 5 and 6, with the split, filtered and amplified RF signals RF1 and RF2 then being combined again in a signal combiner 7.

The RF signals RF1, RF2 which have been processed in this way are now, for example, split equally on the basis of power in a signal splitter 8 and are supplied to a quadrature mixer 9 and to an in-phase mixer 10, respectively, as input signals. The quadrature mixer 9 and the in-phase mixer 10 are also respectively supplied with a quadrature component $Q_{LO}$ and an in-phase component $I_{LO}$ which are produced from a large number of local oscillators LO1, LO2, . . . corresponding to the large number of RF signals. Since, as is shown in FIG. 1, only two RF signals RF1 and RF2 at carrier frequencies of 1800 MHz and 900 MHz are used, two and only two local oscillators LO1 and LO2 are used according to the present invention, which oscillate at a frequency which is slightly below or slightly above the respective carrier frequency, and which respectively produce in-phase and quadrature components. By way of example, the local oscillator LO1 oscillates at a frequency of 1798 MHz, and is thus 2 MHz below the carrier frequency of the RF signal RF1. On the other hand, the second local oscillator LO2 oscillates at a frequency of 899 MHz, and is thus 1 MHz below the carrier frequency of the second RF signal RF2. The chosen frequency differences (2 MHz, 1 MHz) preferably lie in a similar frequency band. In principle, the carrier frequencies also may, of course, lie in a similar (or identical) frequency band (for example, GSM 1800, GSM 1900, DECT), which results in relatively minor problems in the implementation of the multiband receiver.

Figure 3:
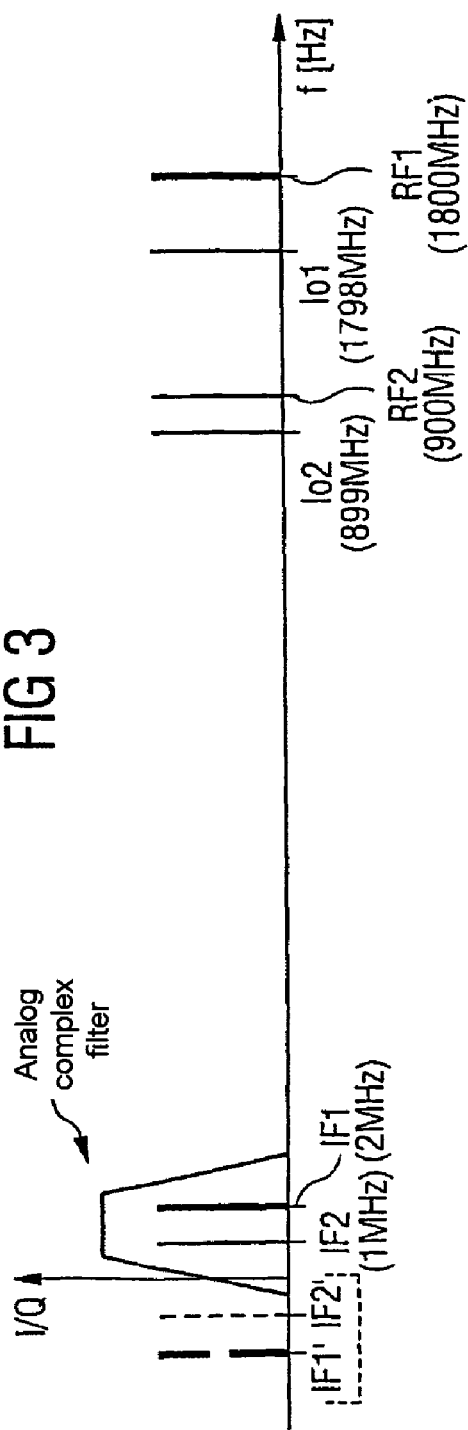
FIG. 3 shows a simplified spectral illustration of the signals which are used according to the first exemplary embodiment.

FIG. 3 shows a simplified spectral illustration of the signals which are used in FIG. 1. In this highly simplified illustration, the RF signal RF1 includes a spectral line at 1800 MHz and the RF signal RF2 includes a spectral line at 900 MHz. The local frequency signals or LO signals lo1 and lo2 which are produced by the local oscillators LO1 and LO2 in consequence occur as spectral lines at frequencies of 1798 MHz and 899 MHz, which are shifted through different frequency differences of 2 MHz and 1 MHz. In this case, FIG. 3 identically illustrates both the in-phase components $I_{LO}$ and the quadrature components $Q_{LO}$, which have been shifted through 90°, although they are supplied to the different mixers, or to the quadrature mixer 9 and to the in-phase mixer 10.

The combination of the mixers 9 and 10 as well as the associated local oscillators LO1, LO2, . . . results in a so-called RF/IF converter for conversion of the large number of RF signals RF1, RF2, . . . to a large number of analog intermediate frequency signals IF1, IF2, as well as the mirror-image signals IF1' and IF2' which are associated with them. To be more precise, as shown in FIG. 1, the quadrature mixer 9 outputs the respective quadrature components of the unreflected intermediate frequency signals IF1 and IF2, as well as the mirror-image intermediate frequency signals IF1' and IF2'. In the same way, the in-phase mixer 10 outputs the in-phase components of the unreflected and mirror-image intermediate frequency signals IF1, IF2 as well as IF1' and IF2'.

The spectral position of these unreflected and mirror-image intermediate frequency signals IF1, IF2, IF1' and IF2' is illustrated in FIG. 3, in which case the convolution of the local oscillator signals lo1 and lo2 results in the intermediate frequency signals IF1 and IF2 which correspond to the RF signals RF1 and RF2 being located in a low intermediate frequency band at the frequencies of 2 MHz and 1 MHz. In this case, the expression "signals in the low intermediate frequency band" is used when their frequency corresponds to the bandwidth of the associated RF signals. If an RF/IF converter is produced for such a low intermediate frequency band, this results in particularly low-cost implementations for the intermediate frequency paths.

The mirror-image intermediate frequency signals IF1' and IF2' now can be canceled out by the use of a downstream analog complex filter AKF as is indicated by the bandpass filtering from about 0 to 3 MHz in FIG. 3. By way of example, the analog complex filtering can be carried out by suitable phase shifting of the in-phase and quadrature components $I_{IF}$, $I_{IF'}$, $Q_{IF}$, $Q_{IF'}$ that are produced by the RF/IF converter in the intermediate frequency band, thus resulting in the mirror-image intermediate frequency signals IF1' and IF2' being at least partially canceled out.

As is shown in FIG. 3, the frequencies of the local oscillators LO1 and LO2 and of the associated signals lo1 and lo2 may be chosen in such a way that no interference occurs, particularly in the event of convolution in the frequency domain. As such, even RF signals whose carrier frequencies are well separated from one another can be changed to a low-frequency intermediate frequency band (LOW IF) which allow simple and low-cost signal processing. In the same way, FIG. 3 shows that the signals lo1 and lo2 which are produced by the local oscillators LO1 and LO2 preferably should be below or above their associated RF signals, so that the associated intermediate frequency signals IF1 and IF2 also are respectively located in the same positive or negative frequency band. This allows the undesirable mirror-image intermediate frequency signals IF1' and IF2' to be reliably suppressed. A so-called polyphase filter preferably is used for the analog complex filter AKF.

The RF/IF converter described above thus allows a large number of RF signals with a frequency separation of Δf which is considerably greater than an associated intermediate frequency bandwidth to be converted to virtually the same intermediate frequency band, in which case, particularly in a low-frequency intermediate frequency band, a situation occurs in which positive and negative frequency bands are located around the zero point. A signal which can be further and easily processed then can be produced using the in-phase and quadrature components of these intermediate frequency signals via a complex analog "image rejection" filter. Low-frequency intermediate frequency signals such as these also allow the filter to be integrated in an RF chip, thus further reducing the costs and the space required. Furthermore, the use of the analog complex filter AKF makes it possible to overcome interfering DC voltage components (DC).

A data signal in the low intermediate frequency band is now produced on the output side of the analog complex filter AKF and optionally can be supplied to a variable IF amplifier 11 and to an IF low-pass filter 12. The intermediate frequency signal, which is still in analog form up to this point, is then converted to a digital intermediate frequency signal via an A/D converter 13 and is further processed by a digital signal processing part DSP in order to produce recovered data signals.

In this digital further-processing, which is known per se, it is possible, for example, for each intermediate frequency which is produced in an intermediate frequency or IF receiving part IF to be used by a local oscillator to produce signal components which are associated with the intermediate frequency signals IF1, IF2. By way of example, as is shown in FIG. 1, a local oscillator ΔO1 may oscillate at the frequency of 2 MHz relating to the intermediate frequency signal IF1, and in each case can be mixed, via a respective mixer 15 or 17, with its in-phase and quadrature component to form the digital input signal. The signals that have been mixed in this way then can be further-processed in digital low-pass filters 16 and 18, thus allowing the signal quality to be improved further. In the same way, this digital signal processing is applied via second local oscillator ΔO2 to the second intermediate frequency signal IF2 at a frequency of about 1 MHz.

Figure 2:
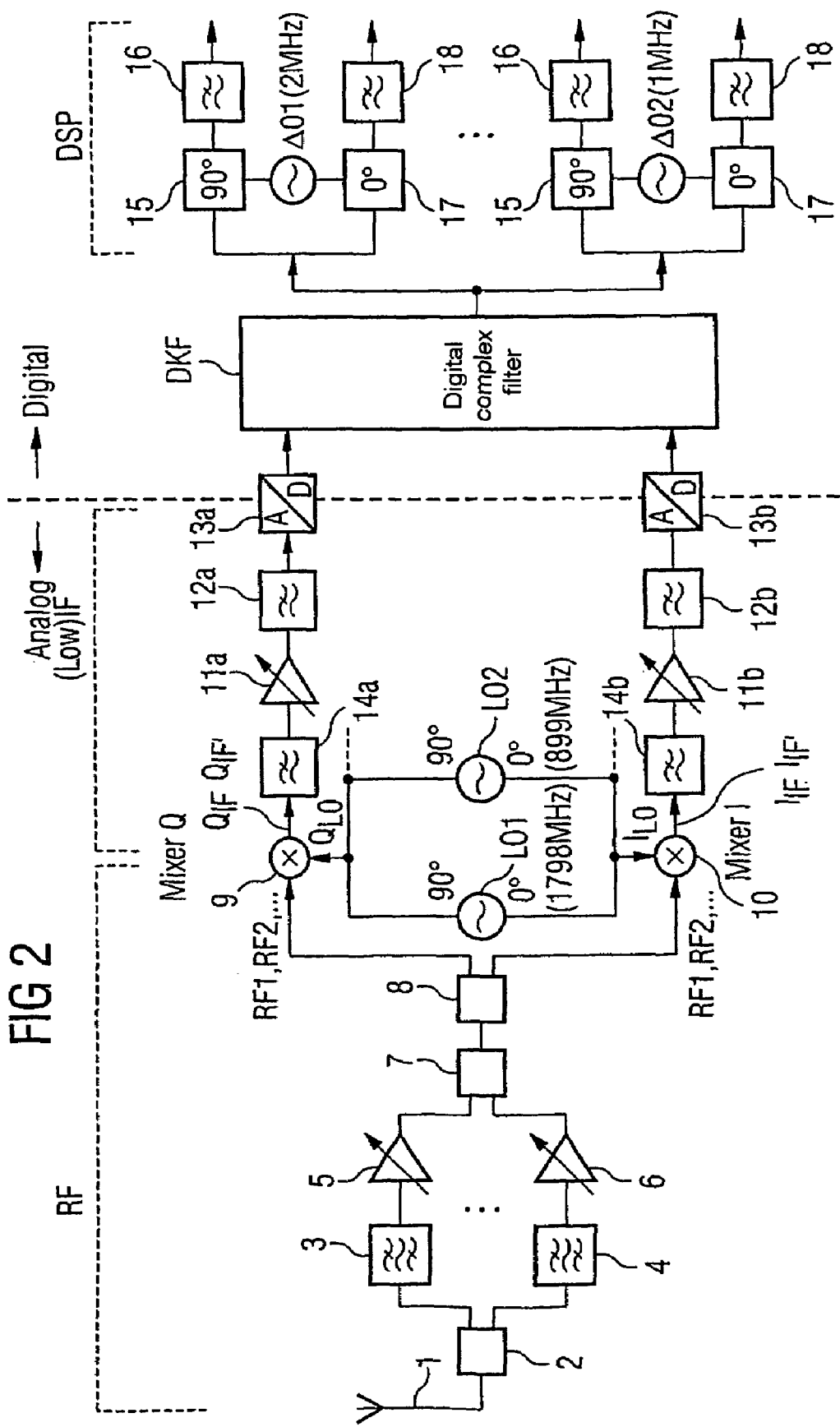
FIG. 2 shows a simplified block diagram of a multiband receiver according to a second exemplary embodiment of the present invention

FIG. 2 shows a simplified block diagram of a multiband receiver according to a second exemplary embodiment, with the same reference symbols denoting the same or corresponding elements, which will not be described again in the following text.

Figure 4:
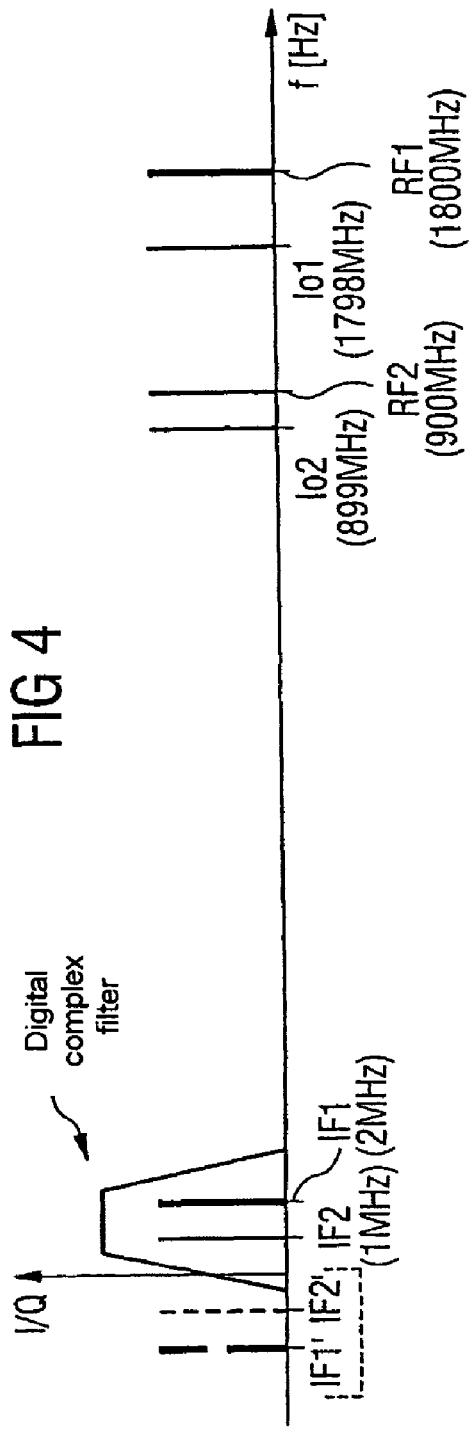
FIG. 4 shows a simplified spectral illustration of the signals which are used according to the second exemplary embodiment.

As is shown in FIG. 2, and in contrast to the exemplary embodiment shown in FIG. 1, a digital complex filter DKF now is used to reduce the mirror-image intermediate frequency signals IF1' and IF2'. In this case, FIG. 4 shows the signals which are associated with the second exemplary embodiment shown in FIG. 2 in a simplified spectral illustration in which there are no differences with respect to the simplified illustration shown in FIG. 3. FIG. 4, therefore, will not be described again in the following text, and reference should be made to the description in FIG. 3.

The major difference between the first exemplary embodiment shown in FIG. 1 and the second exemplary embodiment shown in FIG. 2 is only that the complex filter is now in the form of a digital complex filter DKF and is located in the digital part of the multiband receiver. As a consequence, and as shown in FIG. 2, the quadrature and in-phase components $I_{IF}$, $I_{IF'}$, $Q_{IF}$, $Q_{IF'}$ which are output from the quadrature mixer 9 and from the in-phase mixer 10 of the intermediate frequency signals IF1, IF2, . . . IF1', IF2', . . . are then supplied, for example, to an IF low-pass filter 14a or 14b respectively, and are then passed to an IF amplifier path as is known from FIG. 1.

However, since the complex filter is not provided until the digital part is reached, the IF amplifier path must be provided both for the quadrature components and for the in-phase components, that is to say it must be duplicated, and once again includes, for example, a variable IF amplifier 11a, 11b and an IF low-pass filter 12a and 12b. An A/D converter 13a and 13b, likewise, now must be provided in each case for the quadrature components and for the in-phase components in order subsequently to supply the digitized intermediate frequency signal and its components to the digital complex filter in a known manner for filtering of the mirror-image intermediate frequency signals IF1' and IF2'. The filtering in this case once again basically corresponds to the filtering in the analog complex filter, for which reason, reference at this point should be made to the description relating to FIG. 1.

FIG. 5 shows a simplified spectral illustration of the signals according to a further exemplary embodiment, which is not illustrated, with the same reference symbols denoting identical or corresponding signal lines, which will not be described again in the following text.

As is shown in FIG. 5 and in contrast to the spectral lines in FIGS. 3 and 4, the signals lo1 and lo2 which are produced by the local oscillators are now above the associated RF carrier frequencies RF1 and RF2. To be more precise, the signal lo1 which is produced by the local oscillator LO1 is at 1802 MHz and the signal lo2 is at 901 MHz. As a consequence, the intermediate frequency signals IF1 and IF2 which are produced during the convolution process are now in the negative frequency band at −2 MHz and −1 MHz, while the associated mirror-image intermediate frequency signals IF1' and IF2' are at the frequencies +2 MHz and +1 MHz. In an exemplary embodiment such as this, the analog or digital complex filter must be set such that the negative frequency band is now recovered and the mirror-image intermediate frequency signals which lie in the positive band are at least partially canceled out. The rest of the signal processing is once again comparable to that in the exemplary embodiments described above.

The present invention has been described above with reference to a dual-band telecommunications terminal for carrier frequencies of 1800 MHz and 900 MHz. However, it is not restricted to this and, in fact, relates to all other multiband receivers via which RF signals, some of which are at different frequencies, are received without the use of wires or by cable. In particular, multiband receivers such as these may be used in mobile telecommunications terminals, so-called "software defined radios" and TD-SCDMA products.

Indeed, although the present invention has been described with reference to specific embodiments, those of skill in the

What is claimed is:

1. A multiband receiver for simultaneous reception of a plurality of multiband RF signals, at least some of which being at different carrier frequencies, comprising:
   an RF receiving part for processing the RF signals;
   an RF/IF converter for converting the plurality of RD signals to a plurality of analog intermediate frequency signals, the RF/IF converter including a plurality of local oscillators corresponding to the plurality of RF signals for producing LO signals, which are associated with the carrier frequencies and have LO in-phase components and LO quadrature components, the RF/IF converter also including an in-phase mixer and a quadrature mixer for mixing the respective LO in-phase and quadrature components with the RF signals so as to produce the intermediate frequency signals with IF in-phase components and IF quadrature components in an intermediate frequency band, the RF/IF converter further including a complex filter for effecting complex filtering based on the intermediate frequency signals so as to suppress mirror-image intermediate frequency signals;
   an IF receiving part for processing the intermediate frequency signals;
   an A/D converter for converting the analog intermediate frequency signals to digital intermediate frequency signals; and
   a digital signal processing part for digital signal processing of the digital intermediate frequency signals and for producing recovered data signals, wherein the digital signal processing part includes a plurality of local oscillators for producing digital signal components associated with the intermediate frequency signals, and a plurality of digital low-pass filters for filtering the digital signal components.

2. A multiband receiver for simultaneous reception of a plurality of multiband RF signals as claimed in 1, wherein the intermediate frequency signals are produced in a low intermediate frequency band, with the complex filters shifting the phase of the associated IF in-phase components and IF quadrature components so as to at least partially cancel out the mirror-image intermediate frequency signals.

3. A multiband receiver for simultaneous reception of a plurality of multiband RF signals as claimed in claim 2, wherein the mirror-image intermediate frequency signals all lie in a same frequency band, the same frequency band being one of positive and negative.

4. A multiband receiver for simultaneous reception of a plurality of multiband RF signals as claimed in claim 1, wherein the intermediate frequency signals are analog signals, and the complex filter is an analog complex filter.

5. A multiband receiver for simultaneous reception of a plurality of multiband RF signals as claimed in claim 1, wherein the intermediate frequency signals are digital signals, and the complex filter is a digital complex filter.

6. A multiband receiver for simultaneous reception of a plurality of multiband RF signals as claimed in claim 1, wherein the plurality of local oscillators produce LO signals which do not interfere with one another.

7. A multiband receiver for simultaneous reception of a plurality of multiband RF signals as claimed in claim 1, wherein the complex filter is a polyphase filter.

8. A multiband receiver for simultaneous reception of a plurality of multiband RF signals as claimed in claim 1, wherein the RF receiving part includes an antenna and a preamplifier.

9. A multiband receiver for simultaneous reception of a plurality of multiband RF signals as claimed in claim 8, wherein the preamplifier includes a frequency splitter for splitting the RF signals into the respective carrier frequency bands, a plurality of separate amplifier paths for amplifying the RF signals in their respective carrier frequency bands, and a signal combiner for combining the split and amplified RF signals.

10. A multiband receiver for simultaneous reception of a plurality of multiband RF signals as claimed in claim 9, wherein the amplifier paths each include an RF band pass filter and a variable RF amplifier.

11. A multiband receiver for simultaneous reception of a plurality of multiband RF signals as claimed in claim 1, wherein the RF receiving part includes a signal splitter for splitting the RF signals based on power.

12. A multiband receiver for simultaneous reception of a plurality of multiband RF signals as claimed in claim 1, wherein the IF receiving part includes at least one IF amplifier path.

13. A multiband receiver for simultaneous reception of a plurality of multiband RF signals as claimed in claim 12, wherein the IF amplifier path includes a variable IF amplifier and an IF low-pass filter.

14. A method for simultaneous reception of a plurality of multiband RF signals, at least some of which being at different carrier frequencies, the method comprising the steps of:
   providing RF reception for processing the RF signals;
   effecting RF/IF conversion so as to convert the plurality of RF signals to a plurality of analog intermediate frequency signals, with a plurality of LO signals, which correspond to the plurality of RF signals, which are associated with the carrier frequencies and have LO in-phase components and LO quadrature components are produced, wherein the LO in-phase and quadrature components are mixed with the RF signals so as to produce the intermediate frequency signals with IF in-phase components and IF quadrature components in an intermediate frequency band, and wherein complex filtering is effected based on the intermediate frequency signals so as to suppress mirror-image intermediate frequency signals;
   providing IF reception for processing the intermediate frequency signals;
   effecting A/D conversion so as to convert the analog intermediate frequency signals to digital intermediate frequency signals; and
   effecting digital signal processing of the digital intermediate frequency signals and producing recovered data signals, wherein during the digital signal processing, a plurality of local oscillators produce digital signal components associated with the intermediate frequency signals, and wherein the digital signal components are provided to a plurality of digital tow-pass filter for filtering.

15. A method for simultaneous reception of a plurality of multiband RF signals as claimed in claim 14, wherein during the RF/IF conversion process, the intermediate frequency signals are produced in a low intermediate frequency band, with the complex filtering shifting the phase of the associated in-phase components and quadrature components so as to at least partially cancel out the mirror-image intermediate frequency signals.

16. A method for simultaneous reception of a plurality of multiband RF signals as claimed in claim 15, wherein during the RF/IF conversion process, all the mirror-image intermediate frequency signals lie in a same frequency band, the frequency band being one of positive and negative.

17. A method for simultaneous reception of a plurality of multiband RF signals as claimed in claim 14, wherein the intermediate frequency signals are analog signals, with analog complex filtering being effected.

18. A method for simultaneous reception of a plurality of multiband RF signals as claimed in claim 14, wherein the intermediate frequency signals are digital signals, with digitals complex filtering being effected.

19. A method for simultaneous reception of a plurality of multiband RF signals as claimed in claim 14, wherein during the RF/IF conversion process, a plurality of LO signals are produced which do not interfere with one another.

20. A method for simultaneous reception of a plurality of multiband RF signals as claimed in claim 14, wherein the complex filtering is polyphase filtering.

21. A method for simultaneous reception of a plurality of multiband RF signals as claimed in claim 14, wherein during the RF reception process, the RF signals are split into their respective carrier frequency bands, the RF signals are amplified in their respective carrier frequency bands, and the split and amplified RF signals are combined.

22. A method for simultaneous reception of a plurality of multiband RF signals as claimed in claim 14, wherein during the RF reception process, the RF signals are split based on power.

23. A method for simultaneous reception of a plurality of multiband RF signals as claimed in claim 14, wherein variable IF amplification and IF low-pass filtering are effected at least once for IF reception.

* * * * *